: US008022446B2

(12) United States Patent
Huang et al.

(10) Patent No.: US 8,022,446 B2
(45) Date of Patent: Sep. 20, 2011

(54) INTEGRATED SCHOTTKY DIODE AND POWER MOSFET

(75) Inventors: Wan-Hua Huang, Hsinchu (TW);
Kuo-Ming Wu, Hsinchu (TW);
Yi-Chun Lin, Shalu (TW); Ming Xiang Li, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 367 days.

(21) Appl. No.: 11/778,525

(22) Filed: Jul. 16, 2007

(65) Prior Publication Data
US 2009/0020826 A1    Jan. 22, 2009

(51) Int. Cl.
*H01L 29/78* (2006.01)
(52) U.S. Cl. ............... 257/288; 257/371; 257/E29.271
(58) Field of Classification Search .......... 257/288, 257/371
See application file for complete search history.

(56) References Cited

U.S. PATENT DOCUMENTS

| 4,807,010 | A | | 2/1989 | Winnerl et al. | |
| 4,871,686 | A | * | 10/1989 | Davies | 438/328 |
| 5,493,133 | A | * | 2/1996 | Duvvury et al. | 257/111 |
| 2003/0013268 | A1 | * | 1/2003 | Rezvani et al. | 438/414 |
| 2003/0020135 | A1 | * | 1/2003 | Kaminski et al. | 257/484 |
| 2004/0061195 | A1 | | 4/2004 | Okada et al. | |
| 2005/0199918 | A1 | * | 9/2005 | Calafut et al. | 257/260 |
| 2006/0125019 | A1 | * | 6/2006 | Levin et al. | 257/369 |
| 2006/0125040 | A1 | * | 6/2006 | Levin et al. | 257/471 |
| 2007/0007545 | A1 | * | 1/2007 | Salcedo et al. | 257/127 |

FOREIGN PATENT DOCUMENTS

CN       1487600 A       4/2004

* cited by examiner

*Primary Examiner* — Jarrett J Stark
*Assistant Examiner* — Lawrence Tynes, Jr.
(74) *Attorney, Agent, or Firm* — Slater & Matsil, L.L.P.

(57) ABSTRACT

A semiconductor structure includes a semiconductor substrate; a first well region of a first conductivity type in the semiconductor substrate; a metal-containing layer on the first well region, wherein the metal-containing layer and the first well region form a Schottky barrier; and a first heavily doped region of the first conductivity type in the first well region, wherein the first heavily doped region is horizontally spaced apart from the metal-containing layer.

18 Claims, 4 Drawing Sheets

US 8,022,446 B2

INTEGRATED SCHOTTKY DIODE AND POWER MOSFET

TECHNICAL FIELD

This invention relates generally to semiconductor devices, and more particularly to power metal-oxide-semiconductor field effect transistors and Schottky diodes.

BACKGROUND

Schottky diodes are commonly used in applications requiring fast switching, for example, in power circuits. Also, while standard silicon diodes have a forward voltage drop of about 0.6 volts, Schottky diodes voltage drop at forward biases of around 1 mA is in the range of 0.15V to 0.45 V, making them useful in voltage clamping applications and preventing transistor saturation. This is due to the Schottky diode's higher current density.

FIG. 1 illustrates an application including a power circuit to provide a current to a load circuit. The power circuit includes a high side and a lower side with metal-oxide-semiconductor field effect transistors (MOSFET) PM1 and PM2, respectively. When the high side is turned off, the lower side needs to quickly provide a current. However, body diodes Bdiode, which are parasitic diodes, have low switching speeds. Therefore, an external Schottky diode is typically added to improve the switching performance.

Conventionally, discrete Schottky diodes, which are individual Schottky diodes each individually packaged, are used as external Schottky diodes. However, using discrete Schottky diodes have drawbacks. First, the added connecting wires cause an increase in parasitic capacitance and parasitic conductance, and thus the switching speed of the Schottky diodes are degraded. Furthermore, the manufacturing cost and complexity are increased.

Accordingly, what is needed in the art is a semiconductor device that may incorporate Schottky diodes to take advantage of the benefits associated with increased switching speed while at the same time overcoming the deficiencies of the prior art.

SUMMARY OF THE INVENTION

In accordance with one aspect of the present invention, a semiconductor structure includes a semiconductor substrate; a first well region of a first conductivity type in the semiconductor substrate; a metal-containing layer on the first well region, wherein the metal-containing layer and the first well region form a Schottky barrier; and a first heavily doped region of the first conductivity type in the first well region, wherein the first heavily doped region is horizontally spaced apart from the metal-containing layer.

In accordance with another aspect of the present invention, a semiconductor structure includes a semiconductor substrate; a first well region of a first conductivity type in the semiconductor substrate; a Schottky diode; and a MOSFET. The Schottky diode includes a metal-containing layer on the first well region, wherein the metal-containing layer and the first well region form a Schottky barrier. The MOSFET includes a second well region of a second conductivity type opposite the first conductivity type in the first well region; a gate dielectric extending from over the first well region to over the second well region; a gate electrode on the gate dielectric; a source region of the first conductivity type in the second well region and adjacent the gate electrode, wherein the source region is electrically connected to the metal-containing layer; and a drain region of the first conductivity type in the first well region and adjacent the gate electrode.

In accordance with yet another aspect of the present invention, a semiconductor structure includes a semiconductor substrate, a first leg and a second leg. The first leg includes a first n-well region in the semiconductor substrate; a Schottky diode comprising a metal-containing layer on the first n-well region; and a first MOSFET. The first MOSFET includes a first drain region in the first n-well region; a first p-body in the first n-well region and on an opposite side of the first drain region than the metal-containing layer; and a first source region in the first p-body, wherein the first source region is electrically connected to the metal-containing layer. The second leg includes a second n-well region; a second p-body in the second well region; a second MOSFET; and a third MOSFET. The second MOSFET includes a second source region in the p-body; and a second drain region in the second n-well region. The third MOSFET includes a third source region in the p-body, wherein the second and the third source regions adjoin a heavily doped p-type region, and wherein the second and the third source regions are electrically connected to the metal-containing layer; and a third drain region in the second n-well region, wherein the first, the second and the third drain regions are interconnected.

In accordance with yet another aspect of the present invention, a method for forming a semiconductor structure includes providing a semiconductor substrate; forming a first well region of a first conductivity type in the semiconductor substrate; forming a metal-containing layer on the first well region, wherein the metal-containing layer and the first well region form a Schottky barrier; and forming a first heavily doped region of the first conductivity type in the first well region, wherein the first heavily doped region is horizontally spaced apart from the metal-containing layer.

In accordance with yet another aspect of the present invention, a method of forming a semiconductor structure includes providing a semiconductor substrate; forming a first well region of a first conductivity type in the semiconductor substrate; forming a Schottky diode comprising forming a metal-containing layer on the first well region; and forming a MOSFET. The step of forming the MOSFET includes forming a second well region of a second conductivity type opposite the first conductivity type in the first well region; forming a gate dielectric extending from over the first well region to over the second well region; forming a gate electrode on the gate dielectric; forming a source region of the first conductivity type in the second well region and adjacent the gate electrode; connecting the source region to the metal-containing layer; and forming a drain region of the first conductivity type in the first well region.

The advantageous features of the present invention include reduced production cost, and reduced parasitic capacitance and inductance.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel integrated circuit structure having a Schottky diode integrated with a power metal-oxide-semiconductor field effect transistor (MOSFET) is provided. The variations of the preferred embodiments are then discussed. Throughout the various views and illustrative embodiments of the present invention, like reference numbers are used to designate like elements.

Figure 1:
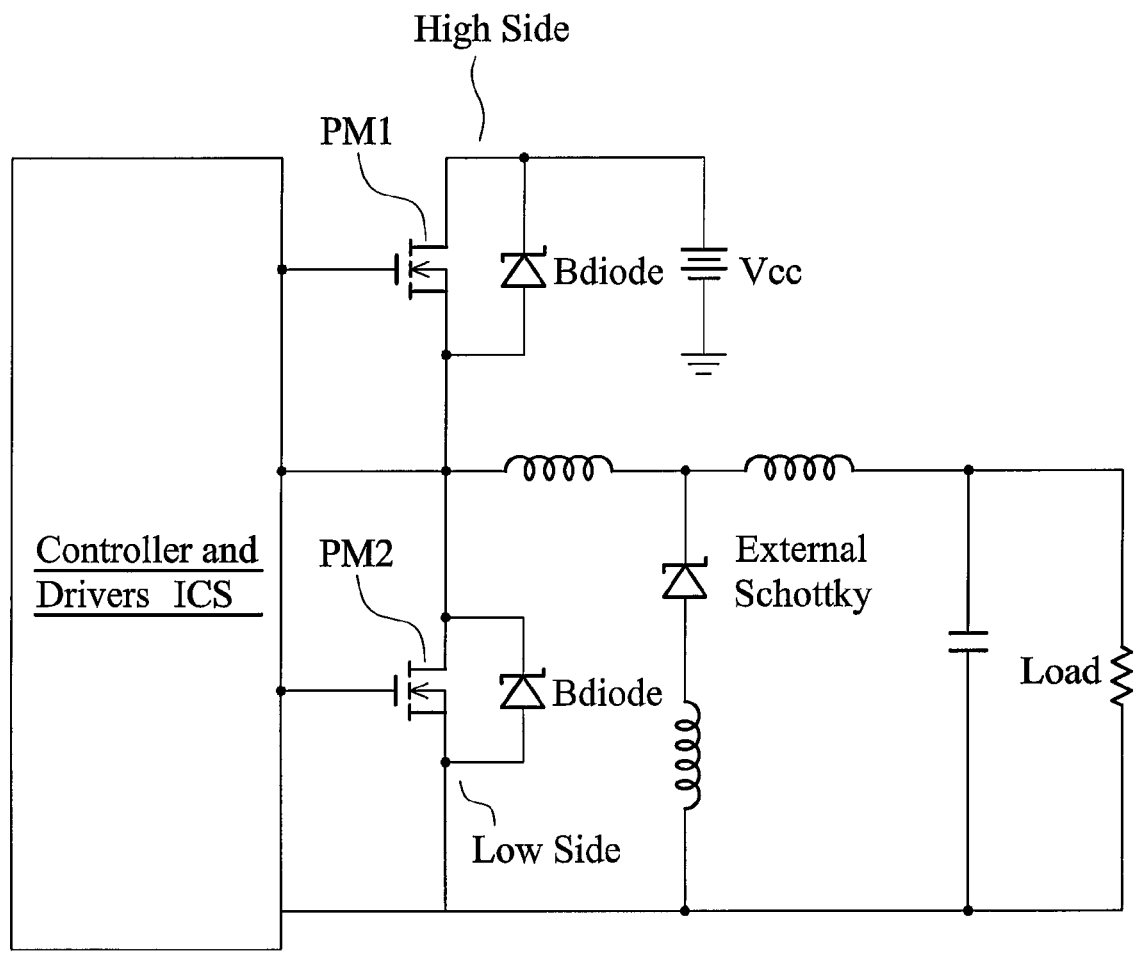
FIG. 1 illustrates a power circuit including power metal-oxide-semiconductor field effect transistors (MOSFET) and an external Schottky diode.
Figure 2:
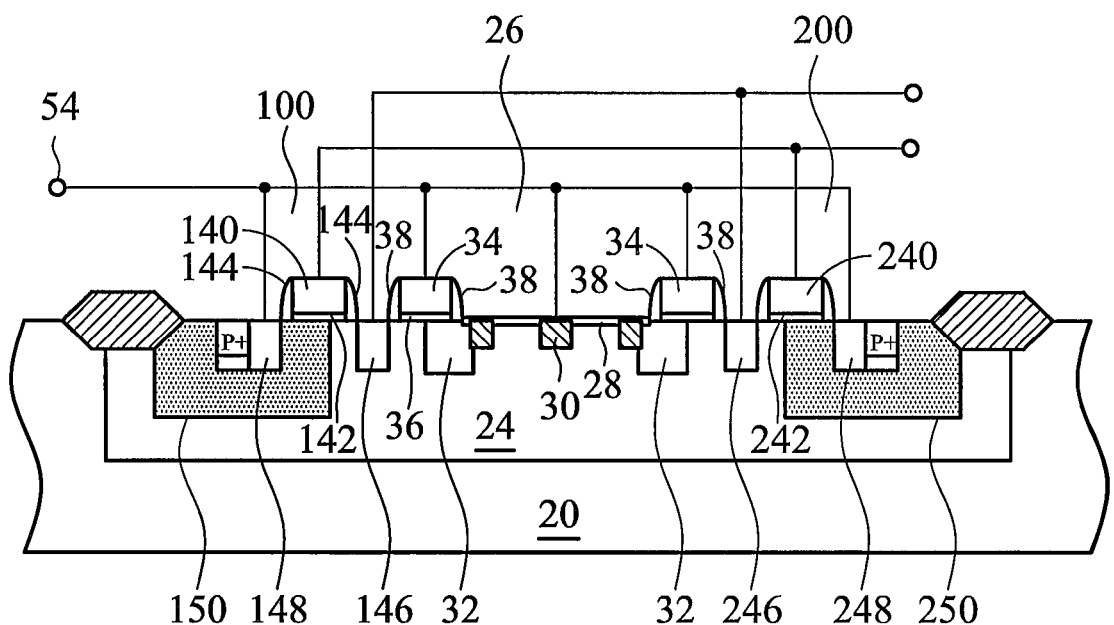
FIG. 2 illustrates a cross-sectional view of an embodiment of the present invention, wherein a power MOSFET and a Schottky diode are integrated on a semiconductor chip.

FIG. 2 illustrates a cross-sectional view of an embodiment of the present invention, wherein devices are formed at the surface of substrate 20. Substrate 20 is a semiconductor substrate formed of a semiconductor material, for example, silicon or other group III, group IV and/or group V elements. N-well region 24, often referred to as high-voltage n-well (HVNW) region 24 for its relatively low impurity concentration, is formed in substrate 20. As is known in the art, HVNW region 24 may be formed by implanting n-type impurities, such as phosphorous and/or arsenic. Alternatively, HVNW region 24 may be formed by epitaxially growing a semiconductor layer on substrate 20, and then performing an n-type impurity implantation. In an exemplary embodiment, HVNW region 24 has an impurity concentration of between about $1E15/cm^3$ and about $1E18/cm^3$.

Schottky diode 26 and a pair of power MOSFETs 100 and 200 are formed at the surface of HVNW region 24. Schottky diode 26 includes a metal-containing layer 28 on HVNW region 24. Partially due to a relatively low impurity concentration in HVNW region 24, a Schottky barrier is formed between metal-containing layer 28 and HVNW region 24. In the resulting Schottky diode, metal-containing layer 28 is the anode, and HVNW region 24 is the cathode.

In an embodiment, metal-containing layer 28 includes a metal silicide. Alternatively, metal-containing layer 28 may include other materials for forming Schottky barriers, such as pure metals, metal compounds, and the like. In an exemplary embodiment, metal-containing layer 28 includes titanium silicide, although other metal silicides, such as $CoSi_2$, $TaSi_2$, and combinations thereof, can be used. The formation of metal-containing layer 28 includes selectively forming a metal layer on HVNW region 24, and performing an annealing to react the metal with the underlying silicon. Preferably, the metal layer is fully consumed during the silicidation process, although a layer of metal may be left un-reacted after the annealing. Metal-containing layer 28 preferably has a thickness of between about 5 nm and about 400 nm.

Heavily doped p-type (P+) contact regions 30 are formed underlying, and in physical contact with metal-containing layer 28. In the described embodiments, heavily doped means an impurity concentration of greater about $10^{20}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. In the preferred embodiment, the formation of P+ contact regions 30 include forming an interlayer dielectric (ILD, not shown) over metal-containing layer 28, forming contact openings (not shown) in the ILD, and implanting a p-type impurity through the contact openings. The implanted p-type impurity penetrates metal-containing layer 28 into the underlying HVNW region 24. P+ contact regions 30 may be spaced apart from each other by HVNW region 24. More preferably, P+ contact regions 30 are formed simultaneously with the formation of other P+ contact regions that are used for forming pickup regions, such as the P+ contact regions 30' in an additional leg (refer to FIG. 5). Experiments have revealed that the formation of P+ contact regions 30 has the effect of reducing leakage current in Schottky diode 26.

To further reduce the leakage currents at the corners of the Schottky diode 26, p-type regions 32 are formed underneath the corners of metal-containing layer 28. Preferably, p-type regions 32 have portions overlapping edge portions metal-containing layer 28, and are in contact with metal-containing layer 28.

Figure 4:
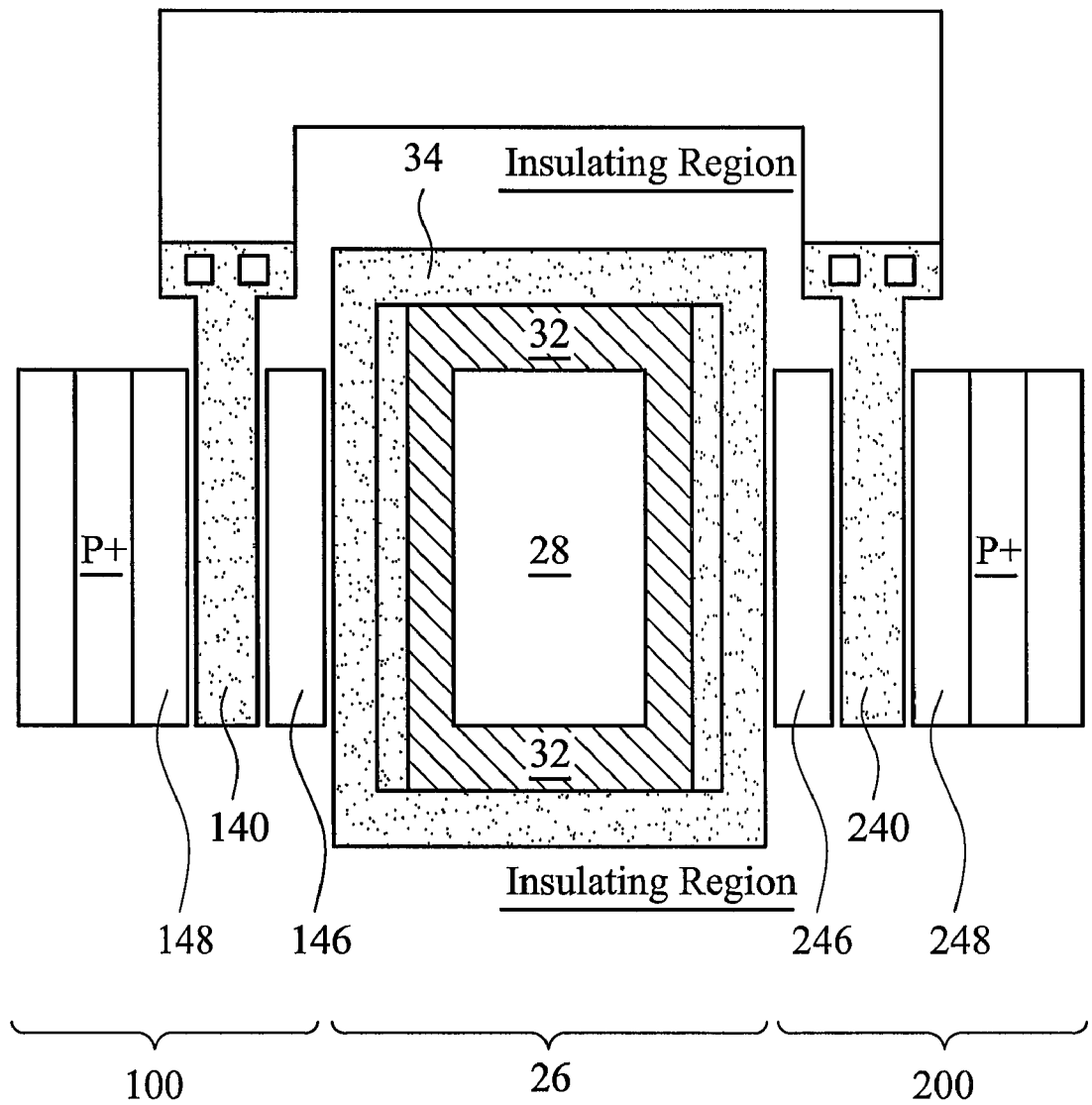
FIG. 4 illustrates a layout of the structure shown in FIG. 2.

Dummy gates 34 are formed over HVNW region 24. Preferably, dummy gates 34 overlap portions of p-type regions 32, and are electrically insulated from p-type regions 32 and metal-containing layer 28 by dielectric layers 36 and gate spacers 38, respectively. It is noted that although in the cross-sectional view, dummy gates 34 are shown as two features spaced apart from each other, in a top view dummy gates 34 may form a continuous loop encircling metal-containing layer 28, as is shown in FIG. 4. Similarly, p-type regions 32 may form a continuous loop also substantially encircling metal-containing layer 28. Dummy gates 34 have the function of releasing electrical fields. In the preferred embodiment, dummy gates 34 are grounded.

Power MOSFET 100 includes gate electrode 140, gate dielectric 142 and gate spacers 144. Drain region 146 is formed in HVNW region 24. Source region 148 is formed in p-body 150, and preferably abutting a P+ region. Preferably, drain region 146 and source region 148 are N+ regions. P-body 150 is a p-well region, preferably having an impurity concentration of higher than the impurity concentration of HVNW region 24. Drain region 146, source region 148 and p-body 150 are preferably formed by implantations. Power MOSFET 200 is symmetric to power MOSFET 100 with relative to Schottky diode 26. Power MOSFET 200 includes drain region 246, source region 248, gate electrode 240, and gate dielectric 242.

In the preferred embodiment, gate electrodes 140 and 240 are interconnected, drain regions 146 and 246 are interconnected, and source regions 148 and 248 are interconnected. Accordingly, power MOSFETs 100 and 200 act as a single power MOSFET with an improved drive current. The drain 146 of power MOSFET 100 is connected to the cathode (HVNW region 24) of Schottky diode 26. The sources 146 and 246 of power MOSFETs 100 and 200 and the anode (metal-containing layer 28) are interconnected, and are connected to a node 54. Node 54 may be grounded.

Figure 3:
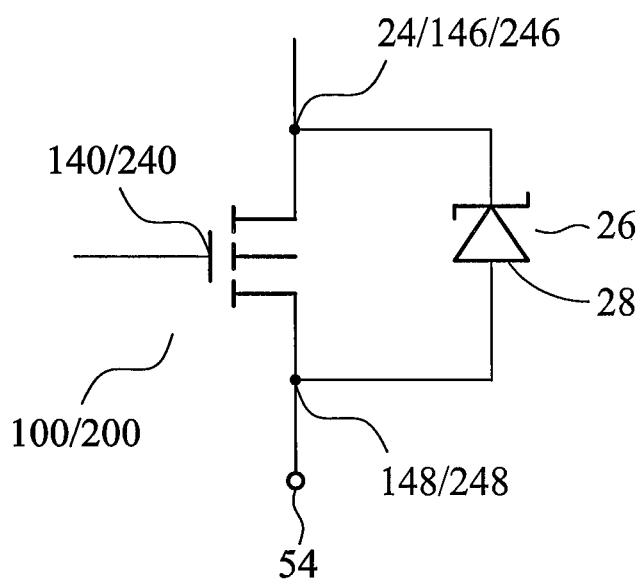
FIG. 3 illustrates an equivalent circuit diagram of the structure shown in FIG. 2.

An equivalent circuit of Schottky diode 26 and power MOSFETs 100 and 200 are shown in FIG. 3, wherein like reference numerals in FIG. 2 are shown in FIG. 3. The circuit shown in FIG. 3 is well suitable for being used as a low side of a power circuit. With the Schottky diode 26, the circuit shown in FIG. 3 has an improved switching performance.

FIG. 4 schematically illustrates an exemplary layout of the structure shown in FIG. 2. It shows that power MOSFETs 100 and 200 are symmetrically laid out relative to metal-containing layer 28. Also, dummy gates 34 and p-type regions 32 each form a ring encircling the rectangular metal-containing layer 28. Dummy gates 34 have four sides, wherein a first and a second side extend in a same direction (first direction) as gates 140 and 240, and a third and a fourth side extend in a second direction perpendicular to the first direction. The third and fourth sides preferably extend over insulating regions, wherein the insulating regions may either be field oxides, or shallow trench isolation (STI) regions. Optionally, the third and fourth sides of dummy gates 34 may each have a portion over p-type region 32.

Typically, to further increase the drive currents of power MOSFETs, a power MOSFET may have a plurality of legs with identical structures. The plurality of legs of the power MOSFET are connected in parallel, that is, the gates of power MOSFETs in each leg are interconnected, and are connected to the gates of power MOSFETs in other legs. Similarly, the respective source regions and drain regions of power MOSFETs in each leg are interconnected, and are connected to the respective source regions and drain regions in other legs of the power MOSFET.

Figure 5:
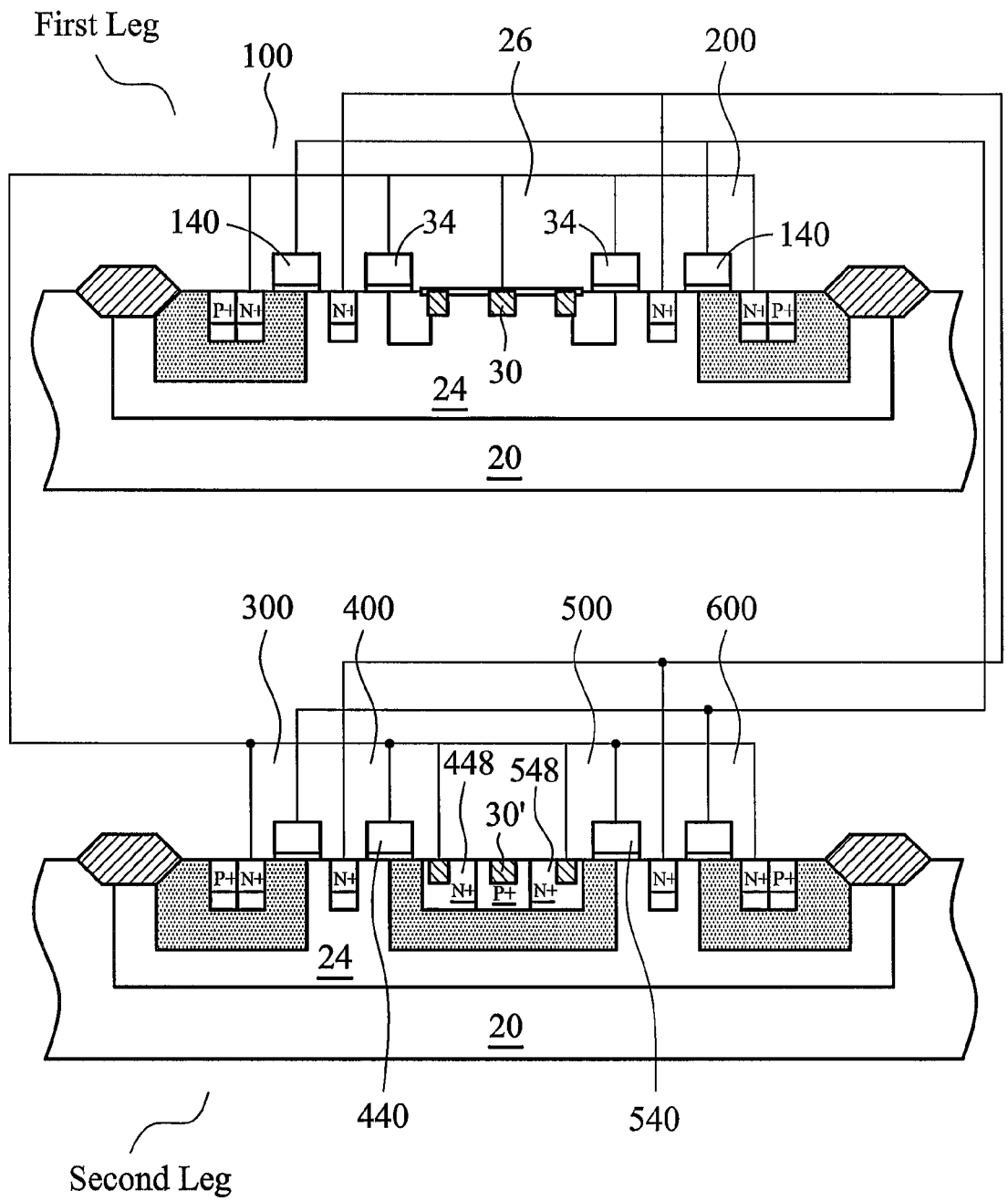
FIG. 5 illustrates a cross-sectional view of an embodiment of the present invention, wherein two legs having different structures are interconnected.

FIG. 5 illustrates a cross-sectional view of an embodiment of the present invention, which includes two legs with different structures. In the first leg, two power MOSFETs 100 and 200 are connected in parallel, and are connected to Schottky diode 26. Therefore, the first leg is the same as the structure shown in FIG. 2. In the second leg, four power MOSFETs 300, 400, 500 and 600 are formed. The source regions 448 and 548 of power MOSFETs 400 and 500 adjoin a P+ contact region 30', which is preferably simultaneously formed as P+ contact region 30. Power MOSFETS 300, 400, 500 and 600 are connected in parallel. Therefore, power MOSFETs 100, 200, 300, 400, 500 and 600 are all connected in parallel, acting as a single MOSFET. Accordingly, the equivalent circuit diagram is similar to the diagram shown in FIG. 3, except the equivalent power MOSFET now has six power MOSFETs parallel connected, providing an even greater drive current.

In the preferred embodiment, to reduce manufacturing cost, gate electrodes 440 and 540 have a same distance as the distance between dummy gates 34. Accordingly, the first and the second legs preferably have the same size.

In a power MOSFET, the plurality of the legs may be a combination of a plurality of legs, each may have either the first leg structure or the second leg structure, and the numbers of first leg structures and the second leg structures depend on the design requirement. The optimum numbers of the first leg structures and the second leg structures may be found through experiments. Please note that the first and second leg structures have a plurality features in common, such as P+ contact regions 30 and 30'. Since there are existing masks for forming power MOSFETs with no built-in Schottky diodes, the existing masks for forming these common features can be used, and only the masks involved in the formation of Schottky diodes need to be generated.

The embodiments of the present invention have several advantageous features. First, Schottky diodes are integrated on-chip with power MOSFETs. The production cost is accordingly reduced. The parasitic capacitance and inductance are also reduced due to the reduced metal wiring. Therefore, the performances of the corresponding circuits are improved. Second, the area of the Schottky diodes can be easily adjusted by modifying different numbers of legs from conventional power MOSFET structures. Third, the formation of the embodiments of the present invention is fully compatible with the existing formation process.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate;
   a first well region of a first conductivity type in the semiconductor substrate;
   a metal-containing layer in a form of a single continuous layer on the first well region, wherein the metal-containing layer and the first well region form a Schottky barrier;
   a first heavily doped region of the first conductivity type in the first well region, wherein the first heavily doped region is horizontally spaced apart from the metal-containing layer; and
   a heavily doped contact region directly underlying and contacting the metal-containing layer, wherein the heavily doped contact region is of a second conductivity type opposite the first conductivity type, and wherein the Schottky barrier comprises portions on opposite sides of, and contacting, the heavily doped contact region.

2. The semiconductor structure of claim 1 further comprising a second well region of the second conductivity type in the first well region.

3. The semiconductor structure of claim 2, wherein the second well region forms a ring encircling a region underlying the metal-containing layer, and wherein inner portions of the second well region overlap outer portions of the metal-containing layer.

4. The semiconductor structure of claim 2, wherein the heavily doped contact region contacts the second well region.

5. The semiconductor structure of claim 2, wherein the portions of the Schottky barrier on the opposite sides of the heavily doped contact region space the heavily doped contact region apart from the second well region.

6. The semiconductor structure of claim 1 further comprising:
   a dummy gate dielectric over the first well region; and
   a dummy gate over the dummy gate dielectric, wherein the dummy gate dielectric and the dummy gate substantially encircle the metal-containing layer.

7. The semiconductor structure of claim 1, wherein the first conductivity type is n-type, and the second conductivity type is p-type.

8. The semiconductor structure of claim 1 further comprising:
   a third well region of the second conductivity type in the first well region;

a gate dielectric extending from over the first well region to over the third well region;

a gate electrode on the gate dielectric, wherein the first heavily doped region is on an opposite side of the gate electrode than a portion of the third well region; and a second heavily doped region of the first conductivity type in the third well region and adjacent the gate electrode, wherein the second heavily doped region is electrically connected to the metal-containing layer.

9. The semiconductor structure of claim 1, wherein the metal-containing layer is grounded.

10. The semiconductor structure of claim 1, wherein the metal-containing layer comprises a metal silicide.

11. The semiconductor structure of claim 10, wherein the metal silicide is titanium silicide.

12. A semiconductor structure comprising:
a semiconductor substrate;
a first well region of a first conductivity type in the semiconductor substrate;
a Schottky diode comprising:
  a metal-containing layer on the first well region, wherein the metal-containing layer and the first well region form a Schottky barrier;
  a ring-shaped well region of a second conductivity type opposite the first conductivity type in the first well region, wherein the ring-shaped well region encircles a region underlying the metal-containing layer, and wherein inner portions of the ring-shaped well region overlap outer portions of the metal-containing layer; and
  a heavily doped contact region underlying and contacting the metal-containing layer and the ring-shaped well region, wherein the heavily doped contact region is of the second conductivity type, and wherein the first well region contacts opposite sidewalls of the heavily doped contact region; and
a MOSFET comprising:
  a second well region of the second conductivity type in the first well region;
  a gate dielectric extending from over the first well region to over the second well region;
  a gate electrode on the gate dielectric;
  a source region of the first conductivity type in the second well region and adjacent the gate electrode, wherein the source region is electrically connected to the metal-containing layer; and
  a drain region of the first conductivity type in the first well region and adjacent the gate electrode.

13. The semiconductor structure of claim 12, wherein the metal-containing layer is a single continuous layer with no break therein.

14. The semiconductor structure of claim 12 further comprising:
a dummy gate dielectric over the first well region; and
a dummy gate over the dummy gate dielectric, wherein the dummy gate dielectric and the dummy gate form a ring encircling the metal-containing layer, and wherein the dummy gate is electrically connected to the source region of the MOSFET.

15. The semiconductor structure of claim 12 further comprising an additional MOSFET, wherein the additional MOSFET and the MOSFET are symmetrical relative to the Schottky diode, and wherein a gate electrode, a source region and a drain region of the additional MOSFET are connected to the gate electrode, the source region and the drain region of the MOSFET, respectively.

16. The semiconductor structure of claim 12, wherein the drain region is between the metal-containing layer and the gate electrode of the MOSFET.

17. The semiconductor structure of claim 12 further comprising a plurality of heavily doped contact regions of the second conductivity type and directly underlying the metal-containing layer, wherein the heavily doped contact region and the plurality of heavily doped contact regions are spaced apart from each other by the first well region.

18. The semiconductor structure of claim 12, wherein the Schottky barrier comprises portions on opposite sides of the heavily doped contact region.

* * * * *